United States Patent
Wang et al.

(10) Patent No.: US 8,071,487 B2
(45) Date of Patent: Dec. 6, 2011

(54) PATTERNING METHOD USING STACKED STRUCTURE

(75) Inventors: Meng-Jun Wang, Taichung County (TW); Yi-Hsing Chen, Changhua County (TW); Jiunn-Hsiung Liao, Tainan County (TW); Min-Chieh Yang, Kaohsiung (TW); Chuan-Kai Wang, Tainan County (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 1000 days.

(21) Appl. No.: 11/464,496

(22) Filed: Aug. 15, 2006

(65) Prior Publication Data
US 2008/0045033 A1    Feb. 21, 2008

(51) Int. Cl.
  *H01L 21/302* (2006.01)
  *H01L 21/461* (2006.01)

(52) U.S. Cl. ............... 438/736; 438/738; 257/E21.035; 257/E21.039

(58) Field of Classification Search ........... 438/736, 438/738; 257/E21.035, E21.039
See application file for complete search history.

(56) References Cited

U.S. PATENT DOCUMENTS

| | | | |
|---|---|---|---|
| 6,025,117 A * | 2/2000 | Nakano et al. | 430/314 |
| 2002/0086547 A1 * | 7/2002 | Mui et al. | 438/710 |
| 2003/0219973 A1 * | 11/2003 | Townsend et al. | 438/631 |

FOREIGN PATENT DOCUMENTS

| | | |
|---|---|---|
| CN | 1450595 | 10/2003 |
| CN | 1472599 | 2/2004 |
| TW | 510020 | 11/2002 |

OTHER PUBLICATIONS

Ruzyllo, J.; "Semiconductor Glossary"; 2004; Prosto Multimedia Publishing; p. 50.*

* cited by examiner

*Primary Examiner* — Stephen W Smoot
*Assistant Examiner* — Vicki B Booker
(74) *Attorney, Agent, or Firm* — Winston Hsu; Scott Margo

(57) ABSTRACT

A stacked structure for patterning a material layer to form an opening pattern with a predetermined opening width in the layer is provided. The stacked structure includes an underlayer, a silicon rich organic layer, and a photoresist layer. The underlayer is on the material layer. The silicon rich organic layer is between the underlayer and the photoresist layer. The thickness of the photoresist layer is smaller than that of the underlayer and larger than two times of the thickness of the silicon rich organic layer. The thickness of the underlayer is smaller than three times of the predetermined opening width.

17 Claims, 11 Drawing Sheets

PATTERNING METHOD USING STACKED STRUCTURE

BACKGROUND OF THE INVENTION

1. Field of Invention

The present invention relates to a semiconductor process. More particularly, the present invention relates to a stacked structure and a patterning method using the stacked structure.

2. Description of Related Art

In a semiconductor process, usually the pattern is formed on the photoresist layer in a process of lithography. Then, the photoresist layer serves as the etching mask to perform the dry or wet etching process so as to transfer the pattern in the photoresist layer to the layer to be patterned beneath the photoresist layer. Along with the high integration of semiconductor devices, the manufacturing critical dimension (CD) of the integrated circuit increasingly becomes small. Therefore, the resolution required by lithography becomes high. In order to satisfy the demands for high resolution, the thickness of the photoresist layer is gradually reduced. However, if the thickness of the photoresist layer is too thin, in the subsequent etching process, it is possible that the photoresist layer serving as the etching mask is completely etched before completely transferring the pattern to the layer to be patterned beneath the photoresist layer. Therefore, it is urgent to find a way to completely transfer the pattern to the layer thereunder by the use of the thin photoresist layer.

SUMMARY OF THE INVENTION

Accordingly, the objective of the present invention is to provide a patterning method using the thin photoresist layer to transfer the pattern.

Another objective of the present invention is to provide a stacked structure applicable to the patterning process, for patterning the material layer with a smaller line width.

The present invention provides a method for patterning a material layer to form an opening pattern with a predetermined opening width in the material layer. In the method, an underlayer, a silicon rich organic layer, and a photoresist layer are sequentially formed on the substrate formed with a material layer. The thickness of the photoresist layer is larger than two times of the thickness of the silicon rich organic layer, but is smaller than the thickness of the underlayer. Then, the photoresist layer is patterned to form the opening pattern in the photoresist layer. Next, the silicon rich organic layer is etched with the photoresist layer serving as a mask, so as to transfer the opening pattern to the silicon rich organic layer. Thereafter, the underlayer is etched with the silicon rich organic layer serving as the mask, so as to transfer the opening pattern to the underlayer. When the opening pattern is completely transferred to the underlayer, the photoresist layer is completely etched. Then, the material layer is etched with the underlayer serving as the mask, so as to transfer the opening pattern to the material layer. When the opening pattern is completely transferred to the material layer, the silicon rich organic layer is completely etched.

According to an embodiment of the present invention, a hard mask layer with the thickness slightly larger than the thickness of the silicon rich organic layer is further provided between the material layer and the underlayer. After etching the underlayer and before etching the material layer, the method further comprises etching the hard mask layer with the silicon rich organic layer and the underlayer serving as the mask, so as to transfer the opening pattern to the hard mask layer. When the opening pattern is completely transferred to the hard mask layer, the silicon rich organic layer is completely etched.

According to an embodiment of the present invention, the thickness of the underlayer is smaller than three times of the predetermined opening width.

According to an embodiment of the present invention, after forming the opening pattern in the photoresist layer and before transferring the opening pattern to the silicon rich organic layer, and/or after etching the hard mask layer and before transferring the opening pattern to the material layer, the method further comprises a trimming step to change the width of the opening pattern.

According to an embodiment of the present invention, the material layer comprises a conductive layer, and the method further comprises etching the conductive layer with the underlayer serving as the mask, so as to transfer the opening pattern to the conductive layer, and then removing the underlayer.

According to another embodiment of the present invention, a conductive layer is further provided between the material layer and the substrate, and the method further comprises removing the underlayer, and then transferring the opening pattern to the conductive layer with the hard mask layer serving as the mask.

According to an embodiment of the present invention, the material of the hard mask layer comprises silicon oxide, silicon nitride, silicon oxynitride, silicon carbide, silicon oxycarbide, and silicon carbonitride.

According to an embodiment of the present invention, the thickness of the photoresist layer is about 500 to 2000 Å, the thickness of the silicon rich organic layer is about 250 to 500 Å, the thickness of the underlayer is about 1000 to 2500 Å, and the thickness of the mask layer is about 250 to 900 Å.

According to an embodiment of the present invention, the thickness of the underlayer is smaller than three times of the predetermined opening width.

According to an embodiment of the present invention, the silicon containing organic layer is formed by spin-coating, and the thickness is the minimum thickness formed by spin-coating.

According to an embodiment of the present invention, the material of the silicon rich organic layer comprises the silicon polymer with the silicon content of 5-30 wt. %.

According to an embodiment of the present invention, the underlayer comprises varnish resin, for example, an I-line photoresist layer.

According to an embodiment of the present invention, the method for patterning the photoresist layer comprises exposing in a process of immersion lithography, and the photoresist layer is a waterproof photoresist layer, or a photoresist material layer covered by a waterproof layer on the top thereof.

According to an embodiment of the present invention, after forming the opening pattern in the photoresist layer and before transferring the opening pattern to the silicon rich organic layer, and/or after etching the underlayer and before transferring the opening pattern to the material layer, the method further comprises a trimming step to change the opening width of the opening pattern.

The present invention further provides a stacked structure for patterning a material layer to form an opening pattern with a predetermined opening width in the material layer. The structure comprises an underlayer, a silicon rich organic layer, and a photoresist layer. The underlayer is disposed on the material layer; the silicon rich organic layer is disposed between the underlayer and the photoresist layer, and the thickness of the photoresist layer is larger than two times of the thickness of the silicon rich organic layer, but is smaller than the thickness of the underlayer.

According to an embodiment of the present invention, the thickness of the underlayer is smaller than three times of the predetermined opening width.

According to an embodiment of the present invention, the stacked structure further comprises a hard mask layer disposed between the material layer and the underlayer, and the thickness of the hard mask layer is slightly larger than the thickness of the silicon rich organic layer.

According to an embodiment of the present invention, the material of the hard mask layer comprises silicon oxide, silicon nitride, silicon oxynitride, silicon carbide, silicon oxycarbide, and silicon carbonitride.

According to an embodiment of the present invention, the material of the underlayer comprises varnish resin, for example, the I-line photoresist layer.

In the present invention, by carefully arranging the configuration order and thickness of each layer in the stacked structure, and by using the characteristic of difference in etching selectivity of the layers, the quite thin photoresist layer can be used to transfer the pattern. Therefore, it is quite suitable for the process of semiconductor device with small line width.

In order to the make aforementioned and other objects, features and advantages of the present invention comprehensible, preferred embodiments accompanied with figures are described in detail below.

DESCRIPTION OF EMBODIMENTS

FIGS. 1A to 1E are schematic cross-sectional views of a patterning method using a stacked structure according to an embodiment of the present invention.

Figure 1A:
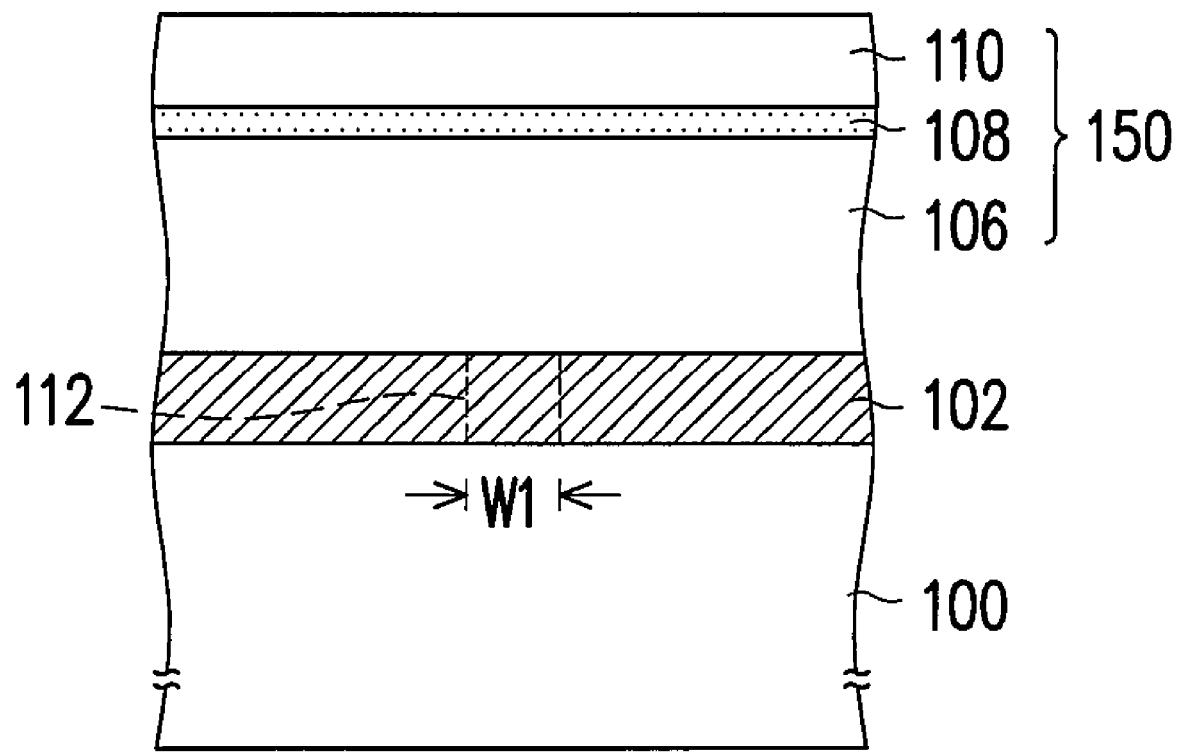
FIGS. 1A to 1E are schematic cross-sectional views of a patterning method using a stacked structure according to an embodiment of the present invention.

Referring to FIG. 1A, the present invention provides a stacked structure 150 for patterning a material layer 102 to form an opening pattern 112 in the material layer 102 on the substrate 100. The opening pattern 112 has a predetermined opening width W1. The stacked structure comprises an underlayer 106, a silicon rich organic layer 108, and a photoresist layer 110. The underlayer 106 is disposed on the material layer 102, and the silicon rich organic layer 108 is disposed between the underlayer 106 and the photoresist layer 110.

The photoresist layer 110 comprises a positive photoresist or a negative photoresist, which is a photoresist material usually used in a conventional lithography process, or a waterproof photoresist layer used in an immersion lithography process, or a photoresist material layer covered by a waterproof layer on the top thereof. The thickness of the photoresist layer 110 is smaller than the thickness of the underlayer 106, but is larger than two times of the thickness of the silicon rich organic layer 108. The material of the silicon rich organic layer 108 comprises an organic silicon material for the bottom antireflective coating (BARC), for example, a silicon polymer with the silicon content of 5-30 wt. %, disclosed in U.S. Pat. No. 6,025,117, which is incorporated herein by reference. The method of forming the silicon rich organic layer 108 is, for example, spin-coating. In an embodiment, the thickness of the silicon rich organic layer 108 is the minimum thickness formed by the spin-coating. The material of the underlayer 106 comprises varnish resin, for example, an I-line photoresist layer. In an embodiment, the thickness of the underlayer 106 is smaller than three times of the predetermined opening width W1.

Figure 1B:
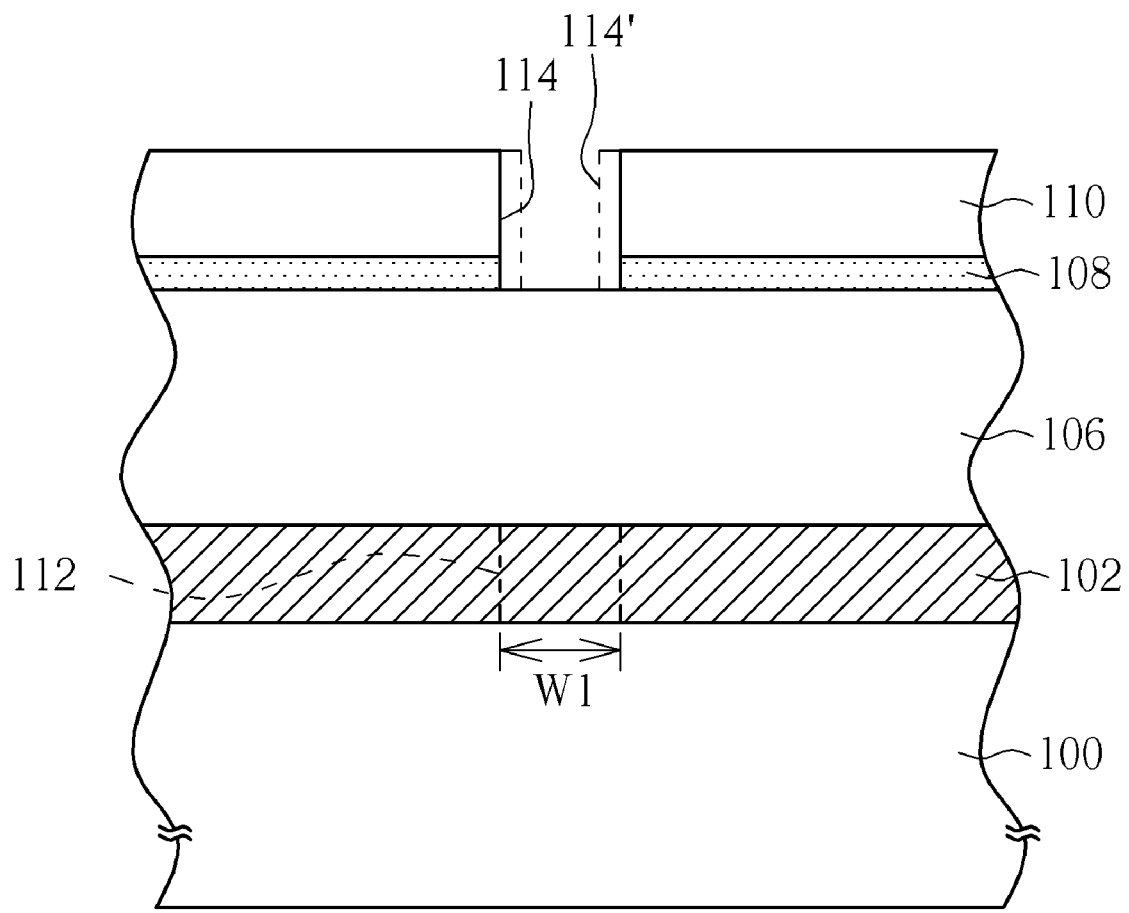

Referring to FIG. 1B, when the stacked structure 150 is used to pattern the material layer 102, the photoresist layer 110 is patterned first, so as to form an opening pattern 114 in the photoresist layer 110. The method of patterning the photoresist layer 110 can adopt the conventional lithography process, or the immersion lithography process to perform an exposure process and then a development process, so as to form the opening pattern 114.

If it is inspected that the opening pattern 114 in the photoresist layer 110 cannot form an opening with the same width W1 as that of the predetermined opening 112 in the subsequent process after development, such as an opening 114', a trimming step for the opening width can be performed before etching the silicon rich organic layer 108 to narrow the opening 114' to opening 114, so as to satisfy the requirement for the width of the opening pattern 114.

Next, the silicon rich organic layer 108 is etched with the photoresist layer 110 serving as the mask, so as to transfer the opening pattern 114 to the silicon rich organic layer 108. The etching method can be dry etching. During the etching process, the photoresist layer 110 loses due to the etching. When the opening pattern 114 is completely transferred to the silicon rich organic layer 108, a small part of the photoresist layer 110 remains on the silicon rich organic layer 108.

Figure 1C:
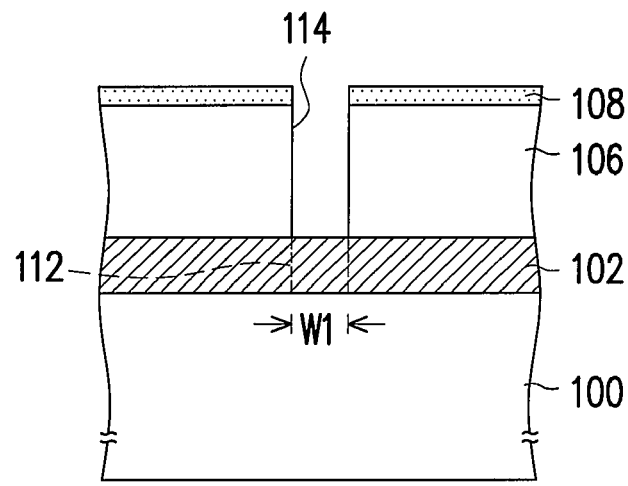

Then, referring to FIG. 1C, the underlayer 106 is etched with the photoresist layer 110 and the silicon rich organic layer 108 serving as the mask, so as to transfer the opening pattern 114 to the underlayer 106. When the opening pattern 114 is completely transferred to the underlayer 106, the photoresist layer 110 is completely etched.

Figure 1D:
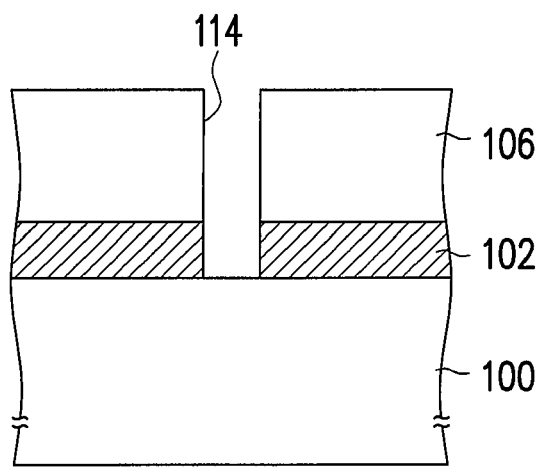

Then, referring to FIG. 1D, the material layer 102 is etched with the silicon rich organic layer 108 serving as the mask, so as to transfer the opening pattern 114 to the material layer 102. When the opening pattern 114 is completely transferred to the material layer 102, the silicon rich organic layer 108 is completely etched. If the silicon rich organic layer 108 is completely etched during the etching process, the underlayer 106 serves as the etching mask to continue etching until the opening pattern 114 is completely transferred to the material layer 102. The method of etching the material layer 102 is, for example, dry etching, and the etching gas varies in accordance with the material layer 102 to be etched.

Figure 1E:
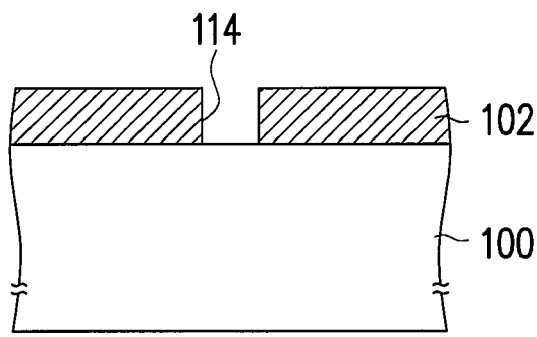

Then, referring to FIG. 1E, the underlayer 106 is removed. The method of removing the underlayer 106 is dry removing or wet removing.

In the stacked structure of the present invention, the stacking sequence and the thickness of each layer are carefully considered, and the details will be illustrated as follows.

The Photoresist Layer:

After the silicon rich organic layer 108 is patterned, when the pattern is transferred to the underlayer 106 thereunder, the etching selectivity ratio between the silicon rich organic layer 108 and the underlayer 106 is quite high, so the thickness of the silicon rich organic layer is required to be quite thin, for example the minimum thickness formed by spin-coating. Therefore, the thickness of the photoresist layer on the silicon rich organic layer is required to be sufficient to serve as the mask for etching the silicon rich organic layer, so as to successfully transfer the pattern to the silicon rich organic layer thereunder. Therefore, the present invention can adopt the photoresist layer having a quite thin thickness, and can adopt the exposing light source having a relatively short wavelength to fabricate the device with small line width.

The Silicon Rich Organic Layer:

After the pattern is transferred to the underlayer 106, when the material layer 102 below the underlayer 106 is etched, the thickness of the silicon rich organic layer 108 serving as the top mask layer is quite thin, so before completely transferring the pattern to the material layer 102, the silicon rich organic layer 108 is completely etched. Thus, after completely transferring the pattern to the material layer 102, the silicon rich organic layer 108 does not remain on the underlayer 106. Therefore, subsequently, the problems that the remaining silicon rich organic layer 108 is difficult to be removed, or during removing, the etchant damages the opening pattern of the material layer 102 or damages the substrate do not exist.

The Underlayer:

After the pattern is transferred to the underlayer 106, when the material layer 102 below the underlayer 106 is etched, even if the silicon rich organic layer 108 is completely etched before the pattern is completely transferred to the material layer 102, because the underlayer 106 has the enough thickness, the pattern can be successfully transferred to the material layer 102. In another aspect, because the thickness of the underlayer 106 is not larger than three times of the predetermined opening width, i.e. when the material layer 102 is etched, the aspect ratio of the opening formed in the underlayer 106 and the material layer 102 is smaller than 3. Thus, the opening pattern 114 can be completely transferred to the material layer 102, and the problem that the opening cannot be formed due to the incomplete etching does not exist.

The stacked structure and the patterning method can be applied in the process of patterning the dielectric layer or the conductive layer. The process method of the gate conductive layer is taken as an example for illustration with reference to FIGS. 2A to 2E in the following.

Figure 2A:
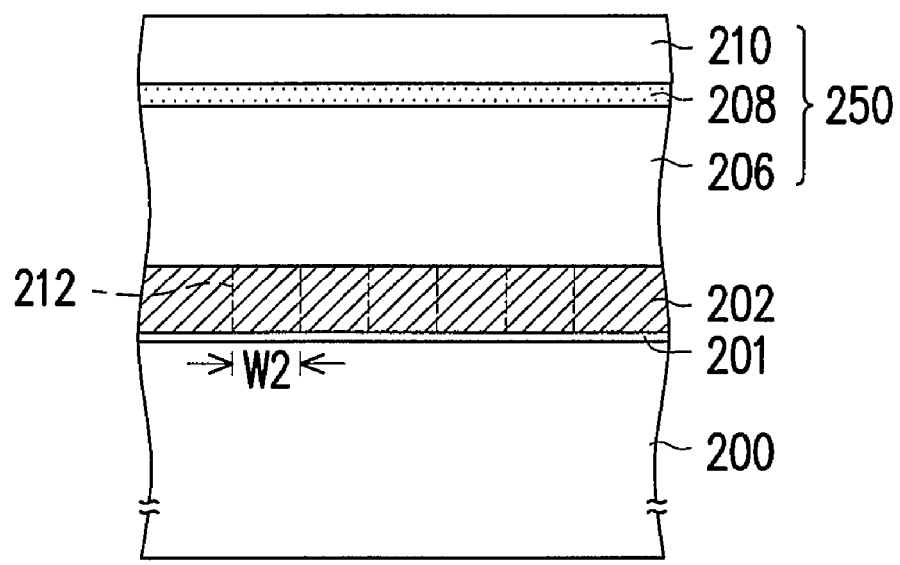
FIGS. 2A to 2E are schematic cross-sectional views of a method of patterning the gate conductive layer by using the stacked structure according to an embodiment of the present invention.

Referring to FIG. 2A, a substrate 200 is provided. The substrate 200 has a gate dielectric layer 201 and a gate conductive layer 202. A plurality of gaps 212 is predetermined to be formed in the gate conductive layer 202, and the predetermined width of the gap 212 is W2. The gate conductive layer 202 is, for example, a doped polysilicon layer, or a polysilicon metal layer composed of the doped polysilicon layer and the silicon metal layer. The stacked structure 250 comprises an underlayer 206, a silicon rich organic layer 208, and a photoresist layer 210. The photoresist layer 210 can adopt the positive photoresist or the negative photoresist, and the thickness thereof is about 500 to 2000 Å. The silicon rich organic layer 208 can adopt the silicon polymer with the silicon content of 5-30 wt. %, disclosed in U.S. Pat. No. 6,025,117, and the thickness thereof is about 250 to 500 Å. The material of the underlayer 206 is, for example, the I-line photoresist layer, and the thickness thereof is about 1000 to 2500 Å.

In an embodiment, the width W2 of the gap 212 between the patterned conductive layers to be formed is 65 nm. The thickness of the silicon rich organic layer 208 is 300 Å. The thickness of the photoresist layer 210 is larger than 600 Å. The thickness of the underlayer 206 is smaller than 1950 Å. In another embodiment, the width W2 of the gap 212 between the patterned conductive layers to be formed is 55 nm. The thickness of the silicon rich organic layer 208 is 300 Å. The thickness of the photoresist layer 210 is larger than 600 Å. The thickness of the underlayer 206 is smaller than 1650 Å. In still another embodiment, the width W2 of the gap 212 between the patterned conductive layers to be formed is 45 nm. The thickness of the silicon rich organic layer 208 is 300 nm. The thickness of the photoresist layer 210 is larger than 600 Å. The thickness of the underlayer 206 is smaller than 1350 Å.

Figure 2B:
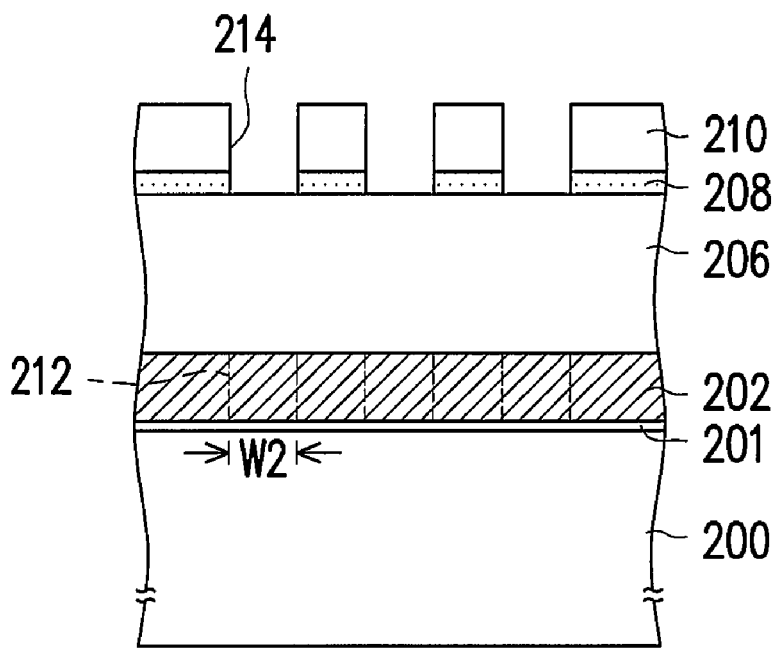

Referring to FIG. 2B, when the conductive layer 202 is patterned by using the stacked structure 250, the photoresist layer 210 is patterned first, so as to form the opening pattern 214 in the photoresist layer 210. The method of patterning the photoresist layer 210 can adopt the conventional lithography process, or can adopt the immersion lithography process to perform the exposure process and then the development process to form the opening pattern 214.

If it is inspected that the opening pattern 214 in the photoresist layer 210 cannot form an gap with the same width W2 as that of the predetermined gap 212 in the subsequent process after development, a step of trimming the gap width can be performed before etching the silicon rich organic layer 208, so as to satisfy the requirement for the width of the opening pattern 214. In the trimming step, $CF_4$ and hydrogen bromide act as the reaction gas to etch the photoresist layer 110.

Then, the silicon rich organic layer 208 is etched with the photoresist layer 210 serving as the mask, so as to transfer the opening pattern 214 to the silicon rich organic layer 208. The etching method can adopt the dry etching by using, for example, fluorine-containing gas, such as perfluorinated compound as the etching gas.

Figure 2C:
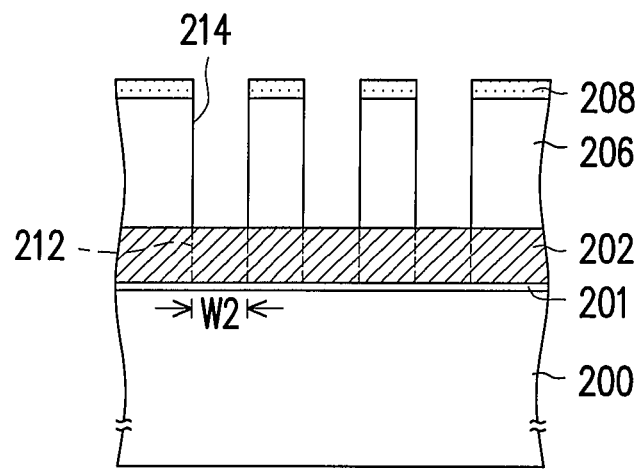

Then, referring to FIG. 2C, the underlayer 206 is etched with the photoresist layer 210 and the silicon rich organic layer 208 serving as the mask, so as to transfer the opening pattern 214 to the underlayer 206. The etching method can adopt the dry etching by using, for example, gas containing oxygen, carbon monoxide, chlorine, and argon as the etching gas. When the opening pattern 214 is completely transferred to the underlayer 206, the photoresist layer 210 is completely etched.

Figure 2D:
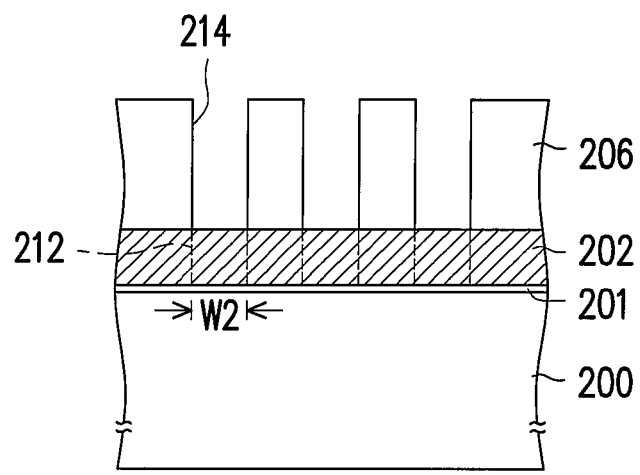

Then, referring to FIG. 2D, the conductive layer 202 is etched with the silicon rich organic layer 208 serving as the mask, so as to transfer the opening pattern 214 to the conductive layer 202. When the opening pattern 214 is completely transferred to the conductive layer 202, the silicon rich organic layer 208 is completely etched. If the silicon rich organic layer 208 is completely etched during the etching process, the underlayer 206 serves as the etching mask to continue etching until the opening pattern 214 is completely transferred to the conductive layer 202. The method of etching the material layer 202 is, for example, the dry etching, and the etching gas is, for example, perfluorocarbon or $SF_6$.

Figure 2E:
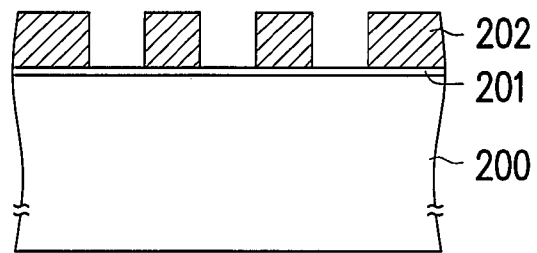

Then, referring to FIG. 2E, the underlayer 206 is removed, such that the patterned conductive layer 202 is exposed. The method of removing the underlayer 206 can adopt the dry removing, for example, $O_2$ plasma ashing.

FIGS. 3A to 3F are schematic cross-sectional views of a patterning method using a stacked structure according to another embodiment of the present invention.

Figure 3A:
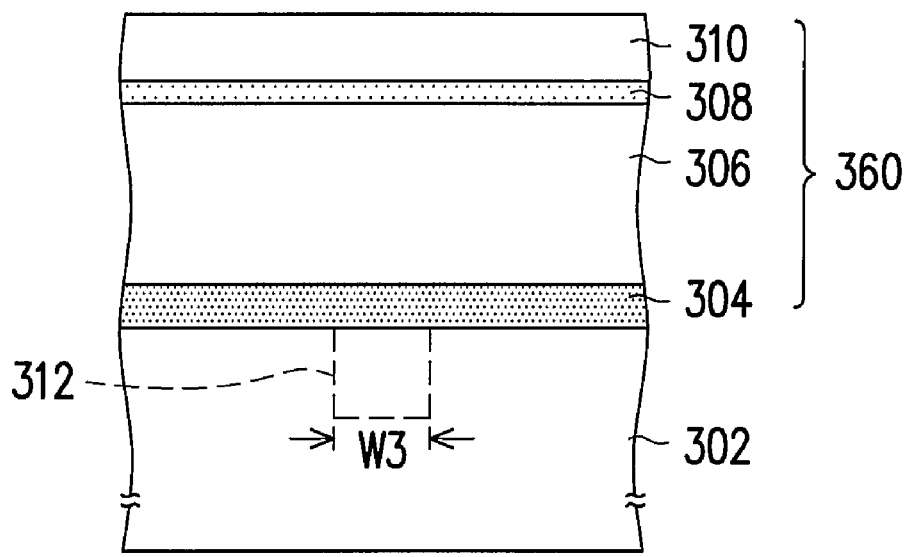
FIGS. 3A to 3F are schematic cross-sectional views of a patterning method using a stacked structure according to another embodiment of the present invention.

Referring to FIG. 3A, the present invention provides a stacked structure 360 for patterning a material layer 302 to form a predetermined opening pattern 312 in the material layer 302. The opening pattern 312 has a predetermined opening width W3. The stacked structure comprises a hard mask layer 304, an underlayer 306, a silicon rich organic layer 308, and a photoresist layer 310. The hard mask layer 304 is disposed on the material layer 302. The underlayer 306 is disposed on the hard mask layer 304. The silicon rich organic layer 308 is disposed between the underlayer 306 and the photoresist layer 310. The thickness of the hard mask layer 304 is slightly larger than the thickness of the silicon rich organic layer 308. The thickness of the photoresist layer 310 is smaller than the thickness of the underlayer 306, but is larger than two times of the thickness of the silicon rich organic layer 308.

The photoresist layer 310 comprises the positive photoresist or the negative photoresist, which is the photoresist material usually used in the conventional lithography process, or the waterproof photoresist layer used in the immersion lithography process, or the photoresist material layer covered by a waterproof layer on the top thereof. The material of the silicon rich organic layer 308 comprises the silicon-containing organic hard mask material for the bottom antireflective coating (BARC), for example, the silicon polymer with the silicon content of 5-30 wt. %, disclosed in U.S. Pat. No. 6,025,117, which is incorporated herein by reference. The forming method is, for example, the spin-coating. In an embodiment, the thickness of the silicon rich organic layer 308 is the minimum thickness formed by spin-coating. The material of the underlayer 306 comprises the varnish resin, for example, the I-line photoresist layer. In an embodiment, the thickness of the underlayer 306 is smaller than three times of the predetermined opening width W3. The material of the hard mask layer 304 is, for example, silicon oxide, silicon nitride, silicon oxynitride, silicon carbide, silicon oxycarbide, or silicon carbonitride. The forming method can adopt chemical vapor deposition.

Figure 3B:
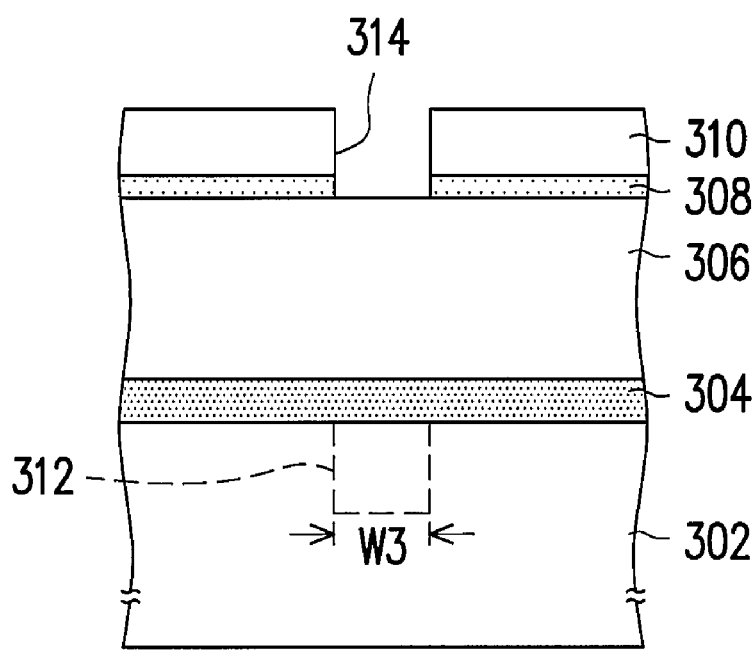

Referring to FIG. 3B, when the material layer 302 is patterned by using the stacked structure 360, the photoresist layer 310 is patterned first, so as to form the opening pattern 314 in the photoresist layer 310. The method of patterning the photoresist layer 310 can adopt the conventional lithography process, or can adopt the immersion lithography process to perform the exposure process and the development process to form the opening pattern 314.

If it is inspected that the opening pattern 314 in the photoresist layer 310 can not form an opening with the same width W3 as that of the predetermined opening 312 in the subsequent process after development, a step of trimming the opening width can be carried out before etching the silicon rich organic layer 308, so as to satisfy the requirement for the width of the opening pattern 314.

Then, the silicon rich organic layer 308 is etched with the photoresist layer 310 serving as the mask, so as to transfer the opening pattern 314 to the silicon rich organic layer 308. The etching method can adopt the dry etching by using, for example, the fluorine-containing gas, such as the perfluorinated compound as the etching gas. During the etching process, the photoresist layer 310 loses due to the etching. When the opening pattern 314 is completely transferred to the silicon rich organic layer 308, a small part of the photoresist layer 310 remains on the silicon rich organic layer 308.

Figure 3C:
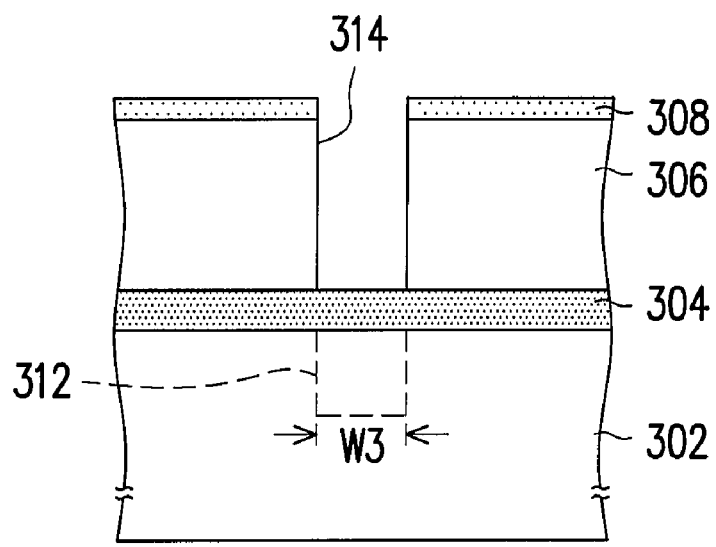

Then, referring to FIG. 3C, the underlayer 306 is etched with the photoresist layer 310 and the silicon rich organic layer 308 as the mask, so as to transfer the opening pattern 314 to the underlayer 306. The etching method of can adopt the dry etching. When the opening pattern 314 is completely transferred to the underlayer 306, the photoresist layer 310 is completely etched.

Figure 3D:
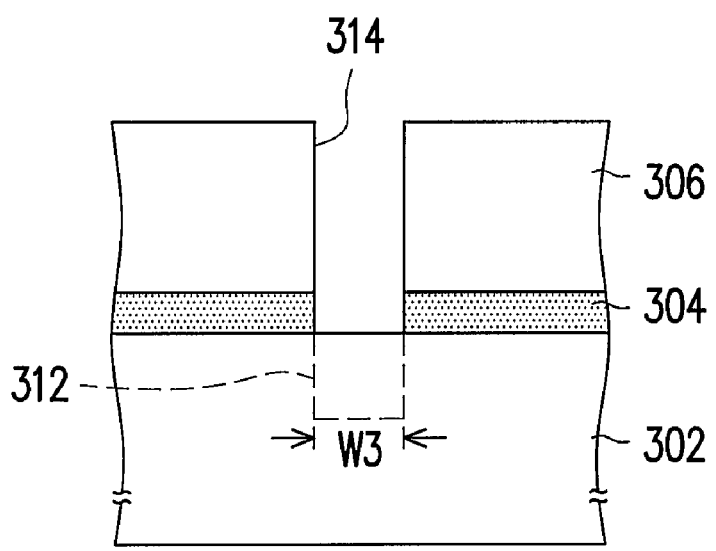

Then, referring to FIG. 3D, the hard mask layer 304 is etched with the silicon rich organic layer 308 and the underlayer 306 as the mask, so as to transfer the opening pattern 314 to the hard mask layer 304. When the opening pattern 314 is completely transferred to the hard mask layer 304, the silicon rich organic layer 308 is completely etched.

After the hard mask layer 304 is etched, when it is found that the opening pattern 314 in the hard mask layer 304 cannot form an opening with the same width W3 as that of the predetermined opening 312 in the subsequent process, a step of trimming the opening width can be performed before etching the material layer 302, so as to satisfy the requirement for the width of the opening pattern 314. During the trimming step, the removing rates of the underlayer 306 and the hard mask layer 304 must be approximately the same, so as to assure the consistency of the opening patterns 314 of the two.

Figure 3E:
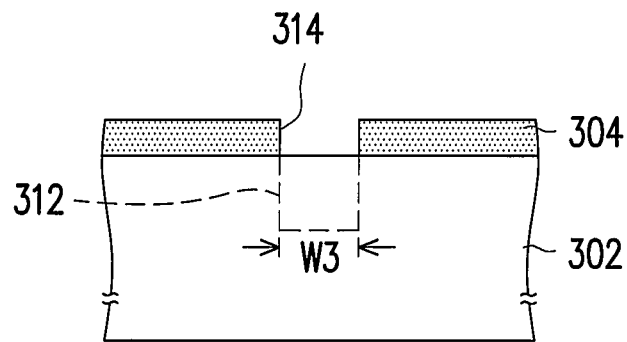
Figure 3E:
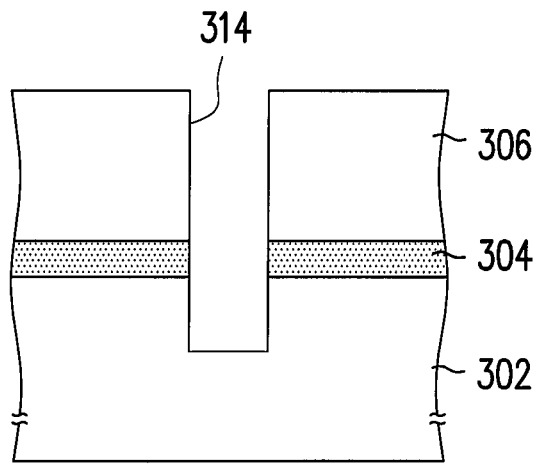
Figure 3F:
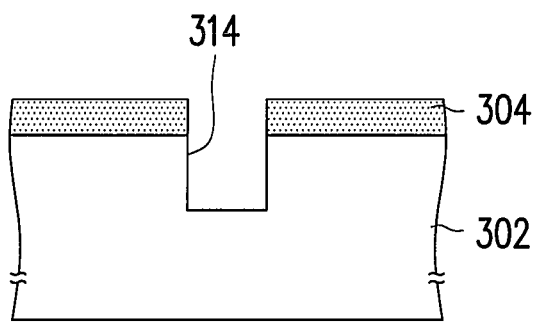

Then, referring to FIG. 3E, the underlayer 306 is removed. The method of removing the underlayer 306 is dry removing or wet removing. The dry removing can adopt the $O_2$ plasma ashing. Then, the material layer 302 is etched with the hard mask layer 304 serving as the mask, so as to transfer the opening pattern 314 to the material layer 302, as shown in FIG. 3F.

Referring to FIG. 3EE, another method involves after the opening pattern 314 is completely transferred to the hard mask layer 304, etching the material layer 302 with the underlayer 306 serving as the mask, so as to transfer the pattern 314 to the material layer 302. If the underlayer 306 is completely etched during the etching process, the hard mask layer 304 serves as the mask to continue etching until the opening pattern 314 is completely transferred to the material layer 302. If the underlayer 306 is not completely etched during the etching process, after the opening patter 314 is completely transferred to the material layer 302, the underlayer 306 is removed, as shown in FIG. 3F.

In the stacked structure of the present invention, the stacking sequence and the thickness of each layer are carefully considered, and the details will be illustrated as follows.

The Photoresist Layer:

After the silicon rich organic layer 308 is patterned, when the pattern is transferred to the underlayer 306 thereunder, the etching selectivity ratio between the silicon rich organic layer 308 and the underlayer 306 is quite high, so the thickness of the silicon rich organic layer 308 is required to be quite thin, for example, the minimum thickness formed by spin-coating. Therefore, the thickness of the photoresist layer 310 on the silicon rich organic layer 308 is required to be sufficient to serve as the mask for etching the silicon rich organic layer 308, so as to successfully transfer the pattern to the silicon rich organic layer 308 thereunder. Therefore, the photoresist layer has a quite thin thickness, and the exposing light source having a relatively short wavelength can be adopted to fabricate the device with small line width.

The Silicon Rich Organic Layer:

After the pattern is transferred to the underlayer 306, when the hard mask layer 304 is etched, the thickness of the silicon rich organic layer 308 serving as the top mask layer is thinner than the thickness of the hard mask layer. Therefore, if the etchant having substantially the same etching rate for the two is selected during the etching process, before the pattern is completely transferred to the hard mask layer 304, the silicon rich organic layer 308 is completely etched. Thus, after the pattern is completely transferred to the hard mask layer 304, no silicon rich organic layer remains on the underlayer 306. Therefore, subsequently, the problems that the remaining silicon rich organic layer is difficult to be removed, or during removing, the etchant damages the opening pattern of the hard mask layer 304 do not exist.

The Underlayer:

After the pattern is transferred to the underlayer 306, when the hard mask layer below the underlayer 306 is etched, even if the silicon rich organic layer 308 is completely etched before the pattern is completely transferred to the hard mask layer 304, because the underlayer 306 has enough thickness, the pattern can be successfully transferred to the material layer 302. In another aspect, because the thickness of the underlayer 306 is not larger than three times of the predetermined width W3 of the opening 312, i.e. when the hard mask layer 304 is etched, the aspect ratio of the opening 314 formed in the underlayer 306 and the hard mask layer 304 is smaller than 3. Thus, the opening pattern 314 can be completely transferred to the hard mask layer 304, and the problem that the opening cannot be formed due to the incomplete etching does not exist.

The Hard Mask Layer:

In order to avoid the incomplete etching, preferably the thickness of the underlayer 306 is not larger than three times of the width W3 of the opening 312. However, if the hard mask layer 304 does not exist, and the depth of the opening 312 to be formed in the material layer 302 is relatively deep, the underlayer 306 must have enough thickness to serve as the etching mask. Otherwise, before the opening depth formed in the material layer 302 reaches the required depth, the underlayer 306 is completely etched. The advantage of adding a hard mask 304 on the underlayer 306 and the material layer 302 is that even if the underlayer 306 is completely etched during the process of etching the material layer 302, the etching rate of the hard mask layer 304 smaller than that of the material layer 302 and far smaller than that of the underlayer 306 such that the hard mask layer 304 can serve as the mask, and thus the required opening may be successfully formed in the material layer 302.

The stacked structure and the patterning method can be applied in the gate conductive layer or the STI process, but it is not limited herein. The method applied in the STI is illustrated in detail with reference to FIGS. 4A to 4F as follows.

Figure 4A:
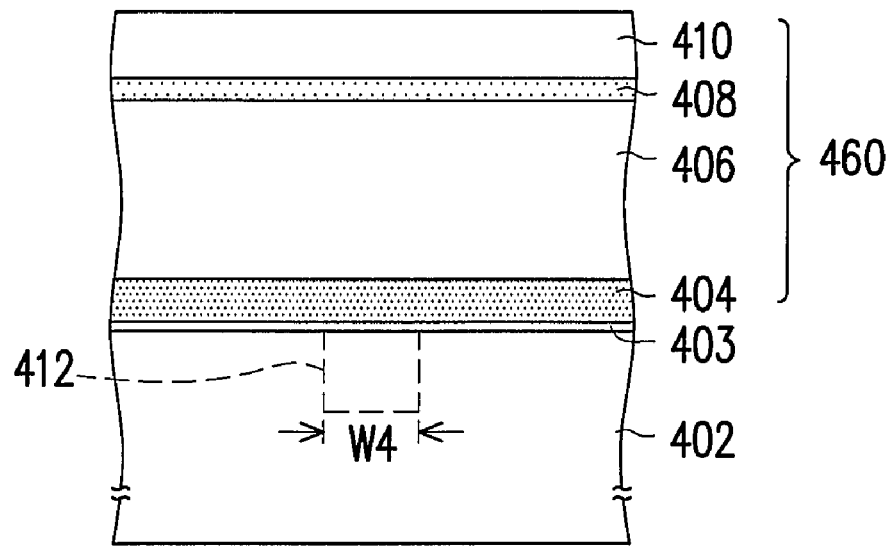
FIGS. 4A to 4F are schematic cross-sectional views of a method of forming the trench of the shallow trench isolation (STI) by using the stacked structure according to another embodiment of the present invention.

Referring to FIG. 4A, a substrate 402 is provided. A plurality of trenches 412 is preformed in the substrate 402, and the predetermined width of the trench 412 is W4. The substrate 402 is, for example, entirely a semiconductor substrate, such as silicon, germanium, SiGe, SiC, or silicon on insulator (SOI). Then, a pad oxide layer 403 and a stacked structure 460 are formed on the substrate 402. The stacked structure 460 comprises a hard mask layer 404, an underlayer 406, a silicon rich organic layer 408, and a photoresist layer 410. The photoresist layer 410 can adopt the positive photoresist or the negative photoresist, and the thickness thereof is about 500 to 2000 Å. The silicon rich organic layer 408 can adopt the silicon polymer with the silicon content of 5-30 wt. %, disclosed in U.S. Pat. No. 6,025,117, the thickness thereof is about 250 to 500 Å. The material of the underlayer 406 is, for example, the I-line photoresist layer, and the thickness thereof is about 1000 to 2500 Å. The material of the hard mask layer 404 is, for example, silicon nitride, and the forming method can adopt the chemical vapor deposition, and the thickness thereof is slightly larger than the thickness of the silicon rich organic layer 408, and is for example, about 250 to 900 Å.

Figure 4B:
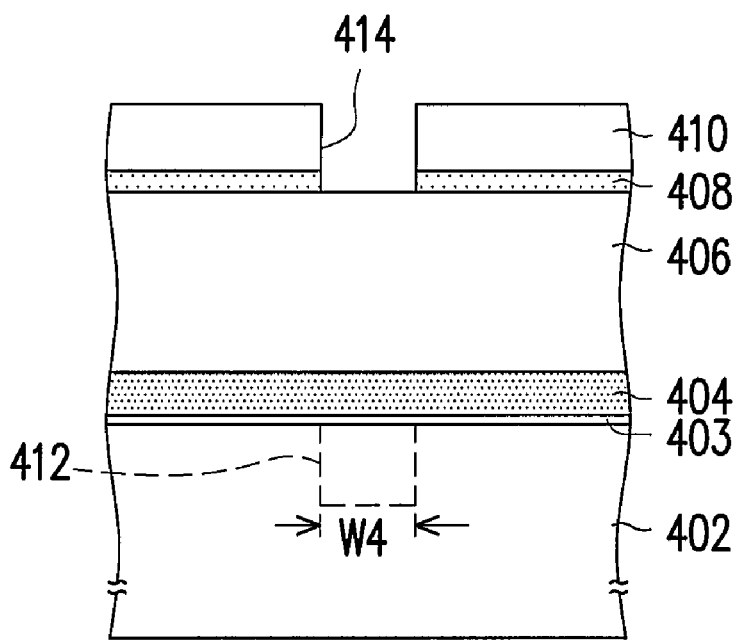

Referring to FIG. 4B, when the substrate 402 is patterned by using the stacked structure 460, the photoresist layer 410 is patterned first, so as to form the trench pattern 414 in the photoresist layer 410. The method of patterning the photoresist layer 410 can adopt the conventional lithography process, or can adopt the immersion lithography process to perform the exposure process and then the development process to form the trench pattern 414.

If it is inspected that the trench pattern 414 in the photoresist layer 410 cannot form a trench with the predetermined width W4 in the subsequent process after development, a step of trimming the trench width can be performed before etching the silicon rich organic layer 408, so as to satisfy the requirement for the width of the trench pattern 414. The trimming step 120 can use $CF_4$ and hydrogen bromide as the reaction gas.

Then, the silicon rich organic layer 408 is etched with the photoresist layer 410 serving as the mask, so as to transfer the trench pattern 414 to the silicon rich organic layer 408. The etching method can adopt the dry etching by using, for example, the fluorine-containing gas, such as the perfluorinated compound as the etching gas. During the etching process, the photoresist layer 410 loses due to the etching. Therefore, when the trench pattern 414 is completely transferred to the silicon rich organic layer 408, a small part of the photoresist layer 410 remains on the silicon rich organic layer 408, or is completely etched.

Figure 4C:
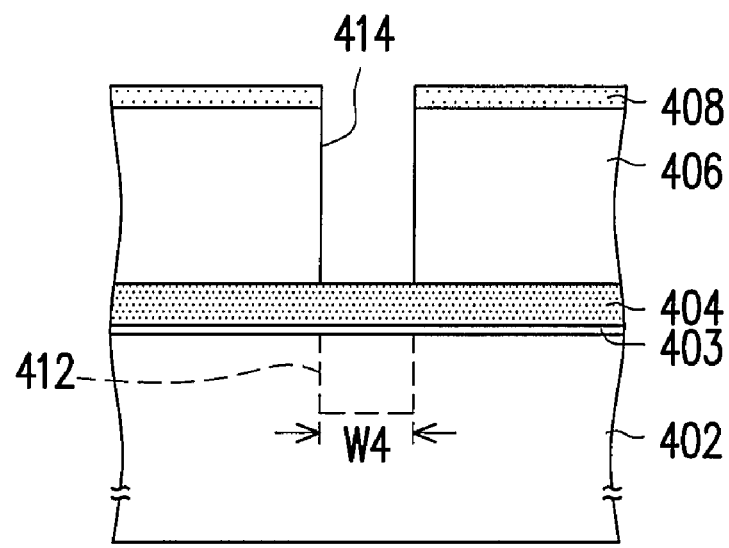

Then, referring to FIG. 4C, the underlayer 406 is etched with the silicon rich organic layer 408 as the mask, so as to transfer the trench pattern 414 to the underlayer 406. The etching method can adopt the dry etching, for example, the gas containing oxygen, carbon monoxide, chlorine, and argon as the etching gas. When the trench pattern 414 is completely transferred to the underlayer 406, the photoresist layer 410 is completely etched.

Figure 4D:
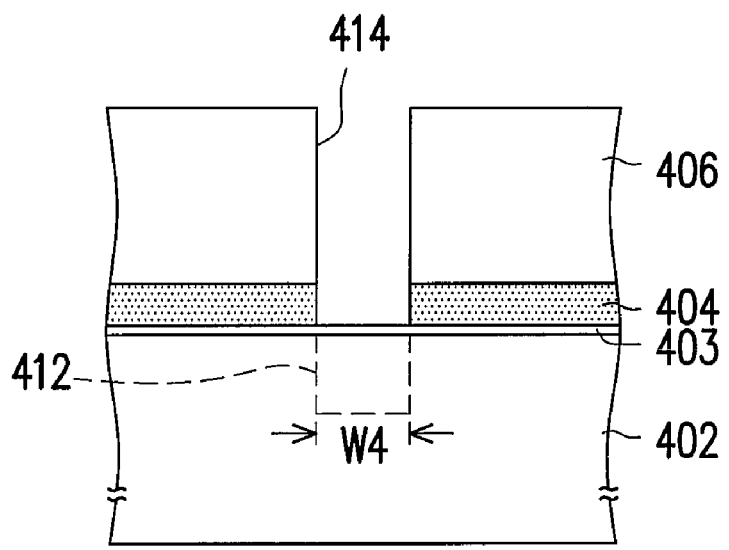

Then, referring to FIG. 4D, the hard mask layer 404 is etched with the silicon rich organic layer 408 and the underlayer 406 as the mask, so as to transfer the trench pattern 414 to the hard mask layer 404. During etching, the etchant having substantially the same etching rate for the silicon rich organic layer 408 and the hard mask layer 404 is selected for etching. Because the thickness of the silicon rich organic layer 408 is smaller than the thickness of the hard mask layer 404, when the trench pattern 414 is completely transferred to the hard mask layer 404, the silicon rich organic layer 408 is completely etched, and no silicon rich organic layer 408 remains on the underlayer 406.

After the hard mask layer 404 is etched, it is found that the trench pattern 414 in the hard mask layer 404 cannot form a trench 412 with the predetermined width W4 in the subsequent process, a step of trimming the trench width can be performed before etching the silicon substrate 402, so as to satisfy the requirement for the width of the trench pattern 414. During the trimming step, the removing rates of the underlayer 406 and the hard mask layer 404 must be substantially the same, so as to assure the consistency of the trench pattern 414 of the two. The trimming step can use $CF_4$ and trifluoromethane as the reaction gas to perform etching, thus complete trimming.

Figure 4E:
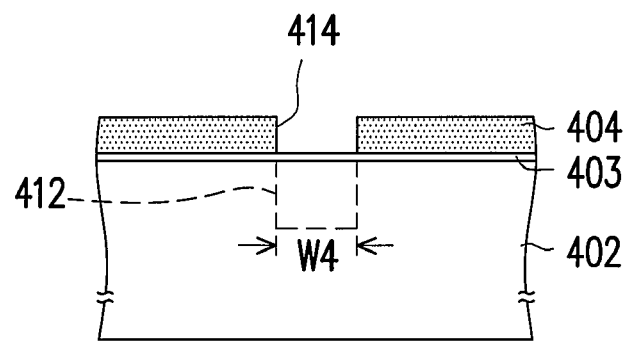
Figure 4E:
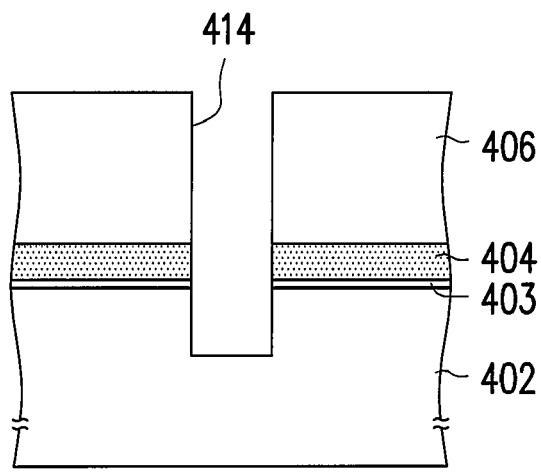
Figure 4F:
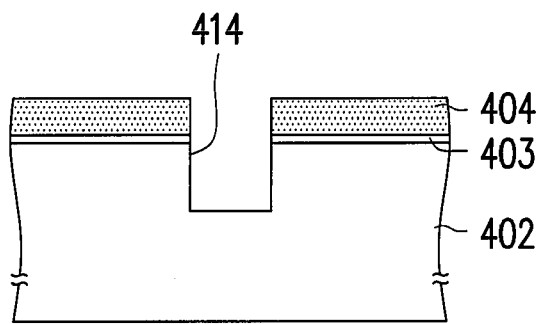

Then, referring to FIG. 4E, the underlayer 406 is removed. The method of removing the underlayer 406 can adopt the dry removing or the wet removing. The dry removing can adopt the $O_2$ plasma ashing. Then, the pad oxide layer 403 and the substrate 402 are etched by using the hard mask layer 404 as the mask, so as to transfer the trench pattern 414 to the substrate 402, as shown in FIG. 4F. The method of etching the substrate 402 can adopt the dry etching by using, for example, perfluorocarbon or $SF_6$ as the etching reaction gas.

Referring to FIG. 4EE, another method involves after the trench pattern 414 is completely transferred to the hard mask layer 404, before removing the underlayer 406, etching the substrate 402 with the underlayer 406 serving as the mask, so as to transfer the opening pattern 414 to the substrate 402 to form the trench. If the underlayer 406 is completely etched during the etching process, the hard mask layer 404 serves as the mask to continue etching until the trench pattern 414 is completely transferred to the substrate 402. If the underlayer 406 is not completely etched during the etching process, after the trench pattern 414 is completely transferred to the substrate 402, the underlayer 406 is removed, as shown in FIG. 4F.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A patterning method for forming an opening pattern with a predetermined opening width in a material layer, comprising:
   providing a substrate having the material layer formed thereon;
   forming an underlayer on the material layer;
   forming a silicon rich organic layer on the underlayer;
   forming a hard mask layer between the material layer and the under layer;
   forming a photoresist layer on the silicon rich organic layer;
   patterning the photoresist layer to form an opening pattern in the photoresist layer;
   etching the silicon rich organic layer with the photoresist layer serving as a mask to transfer the opening pattern to the silicon rich organic layer;
   etching the underlayer with the silicon rich organic layer serving as the mask to transfer the opening pattern to the underlayer, wherein, when the opening pattern is completely transferred to the underlayer, the photoresist layer is completely etched away;
   etching the material layer with the underlayer serving as the mask to transfer the opening pattern to the material layer, wherein, when the opening pattern is completely transferred to the material layer, the silicon rich organic layer is completely etched away; and
   after etching the underlayer and before etching the material layer, etching the hard mask layer with the silicon rich organic layer and the underlayer as mask to transfer only the opening pattern to only the hard mask layer and not to any other layer, and when the opening pattern is completely transferred to the hard mask layer, the silicon rich organic layer is completely etched away.

2. The patterning method as claimed in claim 1, wherein the thickness of the underlayer is smaller than three times of the predetermined opening width.

3. The patterning method as claimed in claim 1, after forming the opening pattern in the photoresist layer and before transferring the opening pattern to the silicon rich organic layer, and/or after etching the hard mask layer and before transferring the opening pattern to the material layer, further comprising a trimming step to change the width of the opening pattern.

4. The patterning method as claimed in claim 1, wherein the method further comprises:
   removing the underlayer after etching the material layer with the underlayer serving as the mask to transfer the opening pattern to the material layer.

5. The patterning method as claimed in claim 1, wherein the method further comprises:
   removing the underlayer; and
   transferring the opening pattern to the material layer with the hard mask layer serving as a mask.

6. The patterning method as claimed in claim 1, wherein the material of the hard mask layer comprises silicon oxide, silicon nitride, silicon oxynitride, silicon carbide, silicon oxycarbide, and silicon carbonitride.

7. The patterning method as claimed in claim 1, wherein the thickness of the photoresist layer is about 500 to 2000 Å, the thickness of the silicon rich organic layer is about 250 to 500 Å, the thickness of the underlayer is about 1000 to 2500 Å, and the thickness of the hard mask layer is about 250 to 900 Å.

8. The patterning method as claimed in claim 1, wherein the silicon containing organic layer is formed in a manner of spin-coating, and the thickness is the minimum thickness formed by spin-coating.

9. The patterning method as claimed in claim 1, wherein the thickness of the photoresist layer is about 500 to 2000 Å, the thickness of the silicon rich organic layer is about 250 to 500 Å, and the thickness of the underlayer is about 1000 to 2500 Å.

10. The patterning method as claimed in claim 1, wherein the material of the silicon rich organic layer comprises an organic silicon polymer with a silicon content of about 5-30 wt. %.

11. The patterning method as claimed in claim 1, wherein the underlayer comprises a varnish resin.

12. The patterning method as claimed in claim 11, wherein the underlayer comprises an I-line photoresist layer.

13. The patterning method as claimed in claim 1, wherein the method of patterning the photoresist layer comprises exposing in a process of immersion lithography process, and the photoresist layer is a waterproof photoresist layer, or a photoresist material layer covered by a waterproof layer on the top thereof.

14. The patterning method as claimed in claim 1, after forming the opening pattern in the photoresist layer and before transferring the opening pattern to the silicon rich organic layer, and/or after etching the underlayer and before transferring the opening pattern to the material layer, further comprising a trimming step to change the opening width of the opening pattern.

15. A patterning method for forming an opening pattern with a predetermined opening width in a material layer, comprising:
   providing a substrate having the material layer formed thereon;
   forming an underlayer on the material layer;
   forming a silicon rich organic layer on the underlayer;
   forming a hard mask layer between the material layer and the under layer, wherein the hard mask layer comprises a thickness slightly larger than the thickness of the silicon rich organic layer;
   forming a photoresist layer on the silicon rich organic layer, the thickness of the photoresist layer being larger than two times of the thickness of the silicon rich organic layer, but smaller than the thickness of the underlayer;
   patterning the photoresist layer to form an opening pattern in the photoresist layer;
   etching the silicon rich organic layer with the photoresist layer serving as a mask to transfer the opening pattern to the silicon rich organic layer;
   etching the underlayer with the silicon rich organic layer serving as the mask to transfer the opening pattern to the underlayer, wherein, when the opening pattern is completely transferred to the underlayer, the photoresist layer is completely etched away;
   removing the underlayer before etching the material layer with the hard mask layer serving as the mask to transfer the opening pattern to the material layer, wherein, when the opening pattern is completely transferred to the material layer, the silicon rich organic layer is completely etched away; and after etching the underlayer and before etching the material layer, etching the hard mask layer with the silicon rich organic layer and the underlayer as mask to transfer the opening pattern to the hard mask layer, and when the opening pattern is completely transferred to the hard mask layer, the silicon rich organic layer is completely etched away.

16. A patterning method for forming an opening pattern with a predetermined opening width in a material layer, comprising:

provided a substrate having the material layer formed thereon;

forming an underlayer on the material layer, wherein the thickness of the underlayer is smaller than three times of the predetermined opening width;

forming a silicon rich organic layer on the underlayer;

forming a hard mask layer between the material layer and the under layer;

forming a photoresist layer on the silicon rich organic layer;

patterning the photoresist layer to form an opening pattern in the photoresist layer;

etching the silicon rich organic layer with the photoresist layer serving as a mask to transfer the opening pattern to the silicon rich organic layer;

etching the underlayer with the silicon rich organic layer serving as the mask to transfer the opening pattern to the underlayer, wherein, when the opening pattern is completely transferred to the underlayer, the photoresist layer is completely etched away;

etching the material layer with the underlayer serving as the mask to transfer the opening pattern to the material layer, wherein, when the opening pattern is completely transferred to the material layer, the silicon rich organic layer is completely etched away; and after etching the underlayer and before etching the material layer, etching the hard mask layer with the silicon rich organic layer and the underlayer as mask to transfer the opening pattern to the hard mask layer, and when the opening pattern is completely transferred to the hard mask layer, the silicon rich organic layer is completely etched away.

17. A patterning method for forming an opening pattern with a predetermined opening width in a material layer, comprising:

providing a substrate having the material layer formed thereon;

forming an underlayer on the material layer;

forming a silicon rich organic layer on the underlayer;

forming a hard mask layer between the material layer and the under layer, wherein the material of the hard mask layer comprises titanium or titanium nitride;

forming a photoresist layer on the silicon rich organic layer;

patterning the photoresist layer to form an opening pattern in the photoresist layer;

etching the silicon rich organic layer with the photoresist layer serving as a mask to transfer the opening pattern to the silicon rich organic layer;

etching the underlayer with the silicon rich organic layer serving as the mask to transfer the opening pattern to the underlayer, wherein, when the opening pattern is completely transferred to the underlayer, the photoresist layer is completely etched away;

etching the material layer with the underlayer serving as the mask to transfer the opening pattern to the material layer, wherein, when the opening pattern is completely transferred to the material layer, the silicon rich organic layer is completely etched away; and after etching the underlayer and before etching the material layer, etching the hard mask layer with the silicon rich organic layer and the underlayer as mask to transfer only the opening pattern to only the hard mask layer and not to any other layer, and when the opening pattern is completely transferred to the hard mask layer, the silicon rich organic layer is completely etched away.

* * * * *